United States Patent [19]

Leclerc du Sablon et al.

[11] 4,123,787
[45] Oct. 31, 1978

[54] ELECTRONIC AND KINEMATIC CONTRIVANCE FOR A SELECTIVE RECORDING OF SIGNALS ON A SINGLE TAPE

[76] Inventors: Bruno Leclerc du Sablon, Le Moulin du Gue, Couzeix; André Dejoux, 15, rue Lakanal, 75015 Paris, both of France

[21] Appl. No.: 705,550

[22] Filed: Jul. 15, 1976

[30] Foreign Application Priority Data

Jul. 17, 1975 [FR] France .................. 75 22293
Jun. 24, 1976 [FR] France .................. 76 19177

[51] Int. Cl.² ................... G11B 15/06; G11B 15/28
[52] U.S. Cl. ................................ 360/74; 226/44; 226/118; 360/90
[58] Field of Search .................. 360/74, 71–73, 360/63, 90, 95–96, 130, 6; 226/118, 113, 119, 44

[56] References Cited

U.S. PATENT DOCUMENTS

| 2,819,940 | 1/1958 | Sorrells | 360/74 |
| 3,682,363 | 8/1972 | Hull | 360/13 |
| 3,916,441 | 10/1975 | Jones | 360/71 |
| 3,942,190 | 3/1976 | Detwiler | 360/74 |
| 3,945,036 | 3/1976 | Karsh | 360/71 |

*Primary Examiner*—Alfred H. Eddleman
*Attorney, Agent, or Firm*—Lane, Aitken, Dunner & Ziems

[57] ABSTRACT

The present invention provides a magnetic tape recorder for recording randomly occurring signals and includes tape supply and takeup reels with associated reel drives and a loop support device to support a loop of magnetic tape extending between the reels. The loop support device is adapted to selectively vary the length of the loop between a maximum and a minimum length. A tape drive capstan and magnetic head are provided between the supply reel and the loop support device to, respectively, transport the magnetic tape from the supply reel to the loop support device and to record data on the tape. Another tape drive capstan and magnetic head are provided between the takeup reel and the loop support device to, respectively, transport the magnetic tape from the loop support device to the takeup reel and to record data on the magnetic tape. An auxiliary capstan is provided to selectively transport the magnetic tape from the takeup reel to the loop support device.

The magnetic tape recorder operates through successive cycles in which the magnetic tape is transported in the forward and reverse direction through various modes, namely, a short loop mode, a short loop to long loop mode, a long loop mode, and a long loop to short loop mode. When a signal is recorded on a tape segment the cycle is interrupted, the tape segment is stored on the takeup reel, and the cycle resumed with a supply of unrecorded magnetic tape from the supply reel.

6 Claims, 5 Drawing Figures

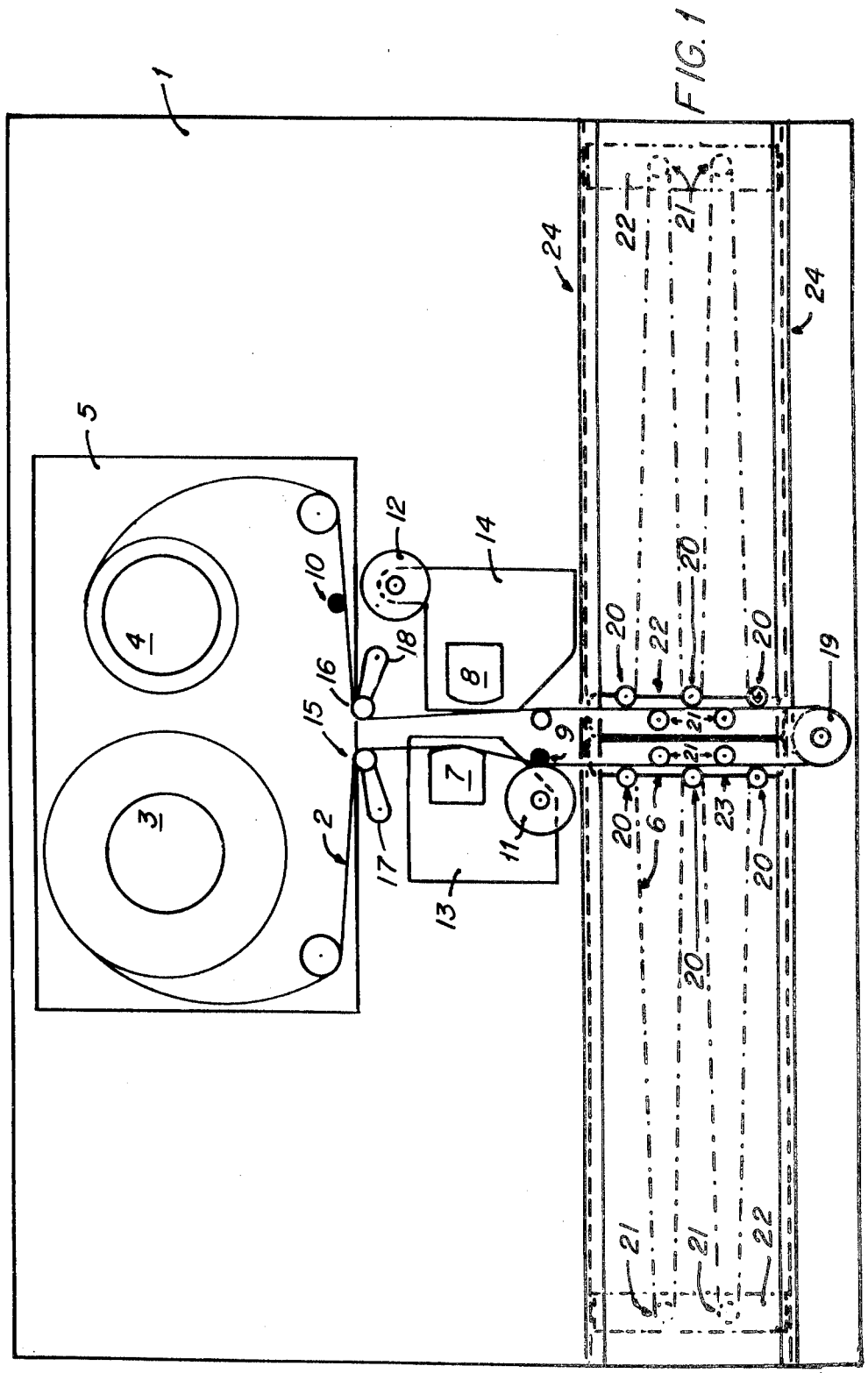

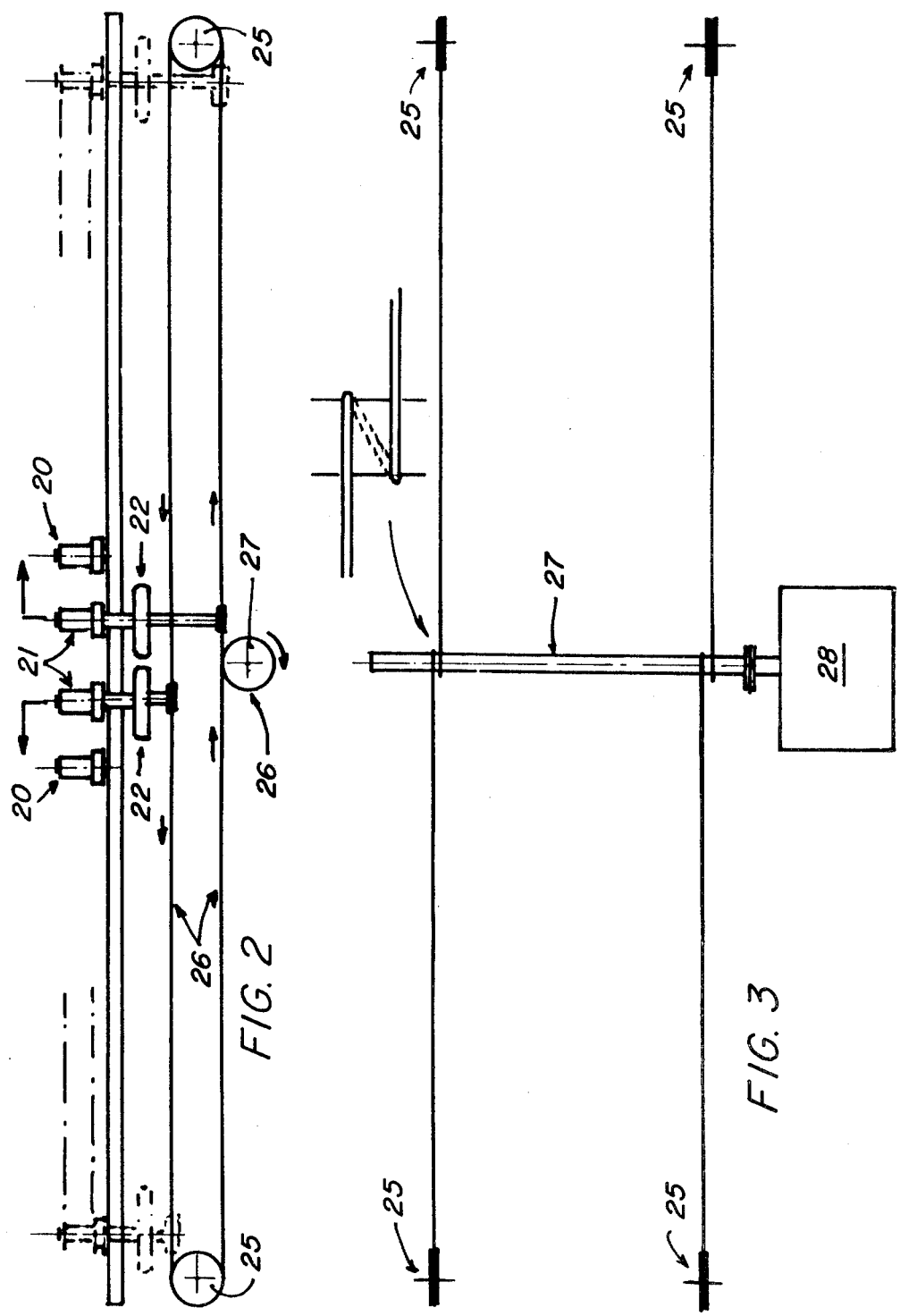

ELECTRONIC AND KINEMATIC CONTRIVANCE FOR A SELECTIVE RECORDING OF SIGNALS ON A SINGLE TAPE

BACKGROUND OF THE INVENTION

The present invention relates to magnetic tape recording devices, or the like, which are capable of recording or registering random, transient signals, or the like, the starting time of which is unknown. The apparatus of the present invention is especially useful in disturbance recording in that a magnetic tape is provided which thereafter may be electronically analyzed.

The apparatus of the present invention is adapted to record signals representing a phenomenon to be studied, including those phenomenons whose origins are physical, mechanical, chemical, electrical, electronic, or the like. Often the phenomenon of interest occurs as abnormalties in the observation of another phenomenon. The ability to observe, locate, and analyze such abnormal phenomenon permits one to study their origin, and evolution and thereby provide for safer and more reliable systems.

Present registering devices use the following basic elements:

A temporary data carrier, a final data carrier, and a device to cause the transfer of the data from the temporary carrier to the final carrier. The transfer device may operate from an order which may be included in the data on the temporary carrier or from auxiliary data.

Existing disturbance recording techniques may take the following form: oscillographs, numerical storage recorders, or magnetic tape recorders. While these devices have certain advantages they also have disadvantages with respect to disturbance recording techniques. Oscillographs have no electronic output for transferring the information, the narrowness of the screen limits the duration of the phenomenon to be observed, there is a preset lag valve, the indicated threshold cannot be accurately determined, the reading precision is low. In addition, the surveillance or watching of the disturbance phenomenon is halted during the storage of interesting data. With respect to numerical storage registers, the amount of data to be stored is limited by the storage registers. Also, the content of the storage registers is not readily transferable due to the fact that the device must remain current carrying. The pass band is inversely proportional to the delay and interdependent on the number of channels. In addition, surveillance is halted during the storage of desired data. With respect to magnetic tape recorders, they usually employ a tape formed in a loop. The frequent passage of the tape causes wear on the loop and the magnetic head. As in the case of the oscillographs and the numerical storage recorders, the surveillance of the phenomenon is often stopped during the loop reading. In addition, magnetic tape recorders of this type are usually expensive.

The present invention overcomes the drawbacks which have characterized prior art devices by providing an apparatus which records disturbances or abnormalties as well as other interesting data in a continuous manner in which the surveillance is not interrupted; advantageously groups the recording of the disturbances on a magnetic tape or other carrier thereby reducing the unused lengths of tape and provides a device in which the observation or surveillance mode is essentially automatic.

The present invention provides an apparatus which achieves these goals and which is capable of recording a phenomenon and thereafter storing it.

A principal characteristic of the present invention is the driving of a magnetic tape in a forward and reverse direction while watching for a signal to be recorded. As soon as such a signal occurs, the forward and reverse motion of the tape is halted and the tape is run in a direction which enables it to be wound on the reception reel with the recorded message. As soon as the information to be recorded is halted, the recorded information is taken out of the surveilance loop and wound onto the takeup reel, while a second reel, called the supply reel, provides an unrecorded length of magnetic tape. This tape is then driven in a forward and reverse motion during a surveilance cycle. Should another signal of interest occur, the recording heads, according to loop position, record this second signal by stopping the surveilance cycle and operating in a recording mode.

The loop forming system includes multi-roller systems having stationary rollers and movable rollers. The movable rollers entrained the tape and may be moved to increase or decrease the length of the loop.

SUMMARY OF THE INVENTION

The present invention provides a magnetic tape recorder for recording randomly occurring signals and includes tape supply and takeup reels with associated reel drives and a loop support device to support a loop of magnetic tape extending between the reels. The loop support device is adapted to selectively vary the length of the loop between a maximum and a minimum length. A tape drive capstan and magnetic head are provided between the supply reel and the loop support device to, respectively, transport the magnetic tape from the supply reel to the loop support device and to record data on the tape. Another tape drive capstan and magnetic head are provided between the takeup reel and the loop support device to, respectively, transport the magnetic tape from the loop support device to the takeup reel and to record data on the magnetic tape. An auxiliary capstan is provided to selectively transport the magnetic tape from the takeup reel to the loop support device.

BRIEF DESCRIPTION OF THE DRAWINGS

The characteristics and advantages of the present invention will be obvious by reading the following description in conjunction with the attached drawings of presently preferred but nonetheless illustrative embodiments in which:

FIG. 1 is a front elevational diagrammatic view of a data recording apparatus in accordance with the present invention;

FIG. 2 is a side elevation view of a loop support device;

FIG. 3 is a plan view of the loop support device shown in FIG. 2;

DESCRIPTION OF THE PREFERRED EMBODIMENTS

Figure 4:
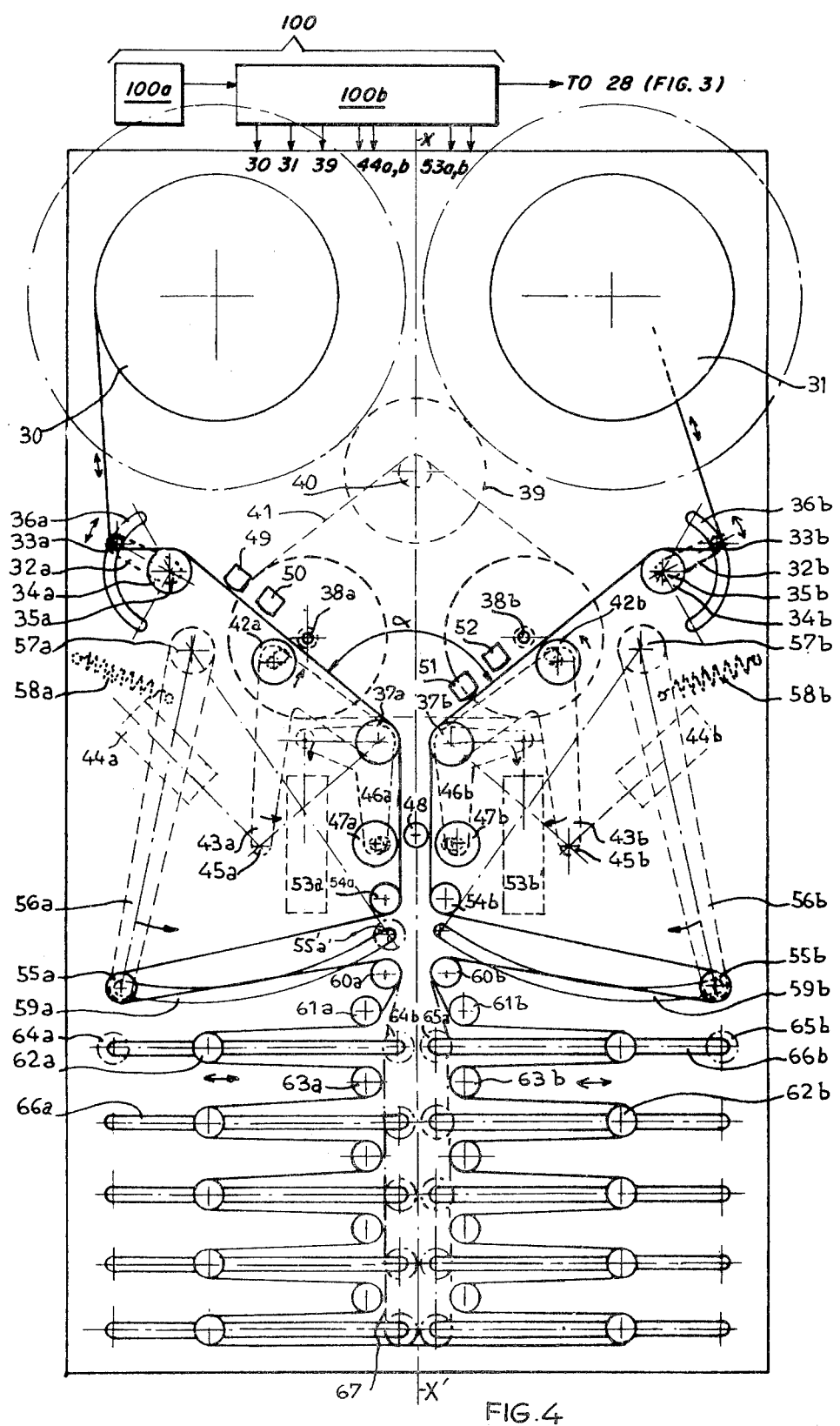
FIG. 4 is a front elevational view of a second embodiment of a data recording apparatus in accordance with the present invention.

Referring to FIG. 1, the reference character 1 refers in general to a tape deck having a supply reel 3 and a takeup reel 4 with a supply of magnetic tape 2 extending therebetween. The reels 3 and 4 may be of the open reel type or may be contained within a conventional cassette 5 or the like. As will be described in more detail below, the magnetic tape 2 is unrolled from the reels 3 and 4 to define a variable length loop 6 which occupies the lower portion of the tape deck 1. Movable supports 13 and 14 are located on opposite sides of the loop 6. The support 13 carries a magnetic head 7 and a rotatably mounted pressure roller 11. In a like manner, the movable support 14 carries another magnetic head 8 and rotatably mounted pressure roller 12. The magnetic heads 7 and 8 are of conventional design and may include heads of the read/record type and the erase type. Both the movable supports 13 and 14 are movable between a retracted position and in operative position. In the operative position, as shown by movable support 13 in FIG. 1, the magnetic tape 2 is in contact with the magnetic head 7, with the pressure roller 11 urging the magnetic tape 2 against a rotatable capstan 9 which thereby transports the magnetic tape 2 past the magnetic head 7. In a like manner, the movable support 14 is movable between a retracted position, shown in FIG. 1, to an operative position in which the magnetic tape 2 is brought into contact with the magnetic head 7 with the pressure roller 12 urging the magnetic tape 2 against a rotatable capstan 10 to thereby transport the magnetic tape 2 past the magnetic head 8. Both the movable supports 13 and 14 may be moved between the operative and retracted positions by any suitable means, including electromagnetic actuators (not shown). Rollers 15 and 16, are rotatably mounted, respectively, on pivotable arms 17 and 18 to assist in guiding the magnetic tape 2 past the movable supports 13 and 14.

The apparatus of the present invention is adapted to support the magnetic tape loop 6 between the supply reel 3 and the takeup reel 4 and selectively increase and decrease the length of loop 6. As used hereinafter, the short loop mode will refer to that mode in which the length of the magnetic tape loop 6 is decreased to its shortest length, and the long loop mode will refer to that mode where the magnetic tape loop 6 is increased to its longest length.

One means for supporting and varying the length of loops 6 is to pass the loop 6 over a rotatable pulley 19 which is mounted for vertical reciprocation on suitable guide members. The vertical movement of the pulley 19 may be controlled by conventional electro-mechanical drive means (not shown). The loop 6 may be increased to its long loop position by moving the pulley 19 downward to its lowermost position (FIG. 1), and the length of the loop 6 may be decreased to its short loop position by moving the pulley 19 upward to its uppermost position.

Another structure for supporting a variable length loop, also shown in FIG. 1, includes first and second sets of stationary rollers 20 and first and second sets of movable rollers 21. The stationary rollers 20 are spaced apart from one another along the vertical, with a set of stationary rollers 20 being provided on each side of the loop 6. The movable rollers 21 are likewise spaced apart from one another along the vertical axis, but are reciprocally removable in the lateral direction between a position where the movable rollers 21 are adjacent the stationary rollers 20 to a position where the movable rollers 21 are adjacent the lateral edges of the tape deck 1. As is readily apparent, the length of the tape loop 6 may be increased from the short loop mode to the long loop mode by moving the movable rollers 21 towards the lateral edges of the tape deck 1 (broken line illustration in FIG. 1) to the short loop mode where the movable rollers 21 are substantially adjacent to stationary rollers 20 (solid line illustration in FIG. 1).

The movable rollers 21 may be moved by means of the structure illustrated in FIGS. 2 and 3. The movable rollers 21 are mounted on suitable supports 22 which are adapted to reciprocate in a lateral direction between an inner short loop position and in laterally outward long loop position. Each support 22 is coupled by a suitable shaft to a flexible cable 26 which is entrained over pulleys 25 and a rotatable shaft 27. A bi-directional drive motor 28 is provided to rotate the shaft 27 and thereby drive the cable 26 around the pulleys and move the rollers 21. The direction in which the movable rollers 21 are reciprocated is determined by the rotational direction of the motor 28.

Another embodiment in accordance with the present invention it is shown in FIG. 4 and includes a frame having a supply reel 30 and a takeup reel 31. Both the reels 30 and 31 are driven, respectively, by suitable bi-directional drive motors, or the like (not shown). The frame is divided symmetrically along the vertical axis X—X' with the reference characters on the left side of the vertical axis X—X' having the suffix "a", and the reference characters on the right side of the vertical axis X—X' having the suffix "b".

A guide lever 32a is provided on the left side of the axis X—X' (broken line illustration) beneath the tape deck panel at a right angle to the supply reel 30. The guide lever 32 is pivotally mounted at one end on a shaft 35a and has a roller 33a rotatably mounted at its distal end which extends through a groove 36a formed in the tape deck panel. Resilient biasing means are provided to resiliently bias the lever 32a. Suitable resilient biasing means may include a torsion or drawback spring (not shown). Another roller 34a is rotatably mounted on the shaft 35a. The magnetic tape from the supply reel 30 is entrained about the rollers 33a and 34a and thereby placed under constant tension.

In a like manner, another guide lever 32b is provided on the right side of the axis X—X' (broken line illustration) beneath the tape deck panel at right angles to the takeup reel 31. The guide lever 32b is pivotally mounted at one end about a shaft 35b and has a roller 33b rotatably mounted at its other end which extends through a groove 36b formed in a tape deck panel. Resilient biasing means are provided to resiliently bias the lever 32b. Another roller 34b is rotatably mounted on the shaft 35b. The magnetic tape leading to the takeup reel 31 is entrained about the rollers 33b and 35b to place the magnetic tape under constant tension.

The magnetic tape leading from both the supply reel 30 and the takeup reel 31 extends towards the vertical axis X—X' at an angle with the tape on both sides of the loop passing around rollers 37a and 37b. A capstan 38a is located on the left side of the vertical axis X—X' and another capstan 38b is located on the right side of the vertical axis X—X'. Each capstan 38a and 38b is coupled, respectively, to a pulley beneath the tape deck panel (broken line illustration). A drive motor 39 having a drive pulley 40 attached to its shaft drives a belt 41 which is entrained about the pulley 40 and the pulleys coupled to the capstans 38a and 38b. Rotation of the drive motor 39 thereby causes the capstans 38a and 38b to rotate.

A pressure roller 42a is rotatably mounted adjacent the capstan 38a on a lever 43a which is adapted to pivot about a shaft 37a to move the pressure roller 42a between a retracted position and an operative position where the magnetic tape is urged against the capstan 38a. The movement of the lever 43a may be controlled by means of an electromagnet 44a coupled by means of a suitable rod to the end 45a of the lever 43a.

In a like manner, a pressure roller 42b is rotatably mounted adjacent to the capstan 38b on a lever 43b which is adapted to pivot about a shaft 37b to move the pressure roller 42b between a retracted position and an operative position where the magnetic tape is urged against the capstan 38b. As in the case of the lever 43a, the movement of the lever 43b may be controlled by means of an electromagnet 44b coupled by means of a suitable rod to the end 45b of the lever 43b.

An auxiliary drive capstan 48 is provided on the vertical axis X—X' below the rollers 37a and 37b. A motor (not shown) is provided to drive the capstan 48 in either a first or second direction and at a slow or fast run.

A lever 46 (broken line illustration) is provided on the left side of the vertical axis X—X' and is pivotally mounted about the shaft upon which the roller 37a is mounted. A roller 47a is rotatably mounted on the lever 46a for movement between a retracted position and an operative position where the roller 47a urges the magnetic tape against the capstan 48.

In a like manner, another lever 46b (broken line illustration) is provided on the right side of the vertical axis X—X' and is pivotally mounted about the shaft upon which the roller 37b is mounted. A roller 47b is rotatably mounted on the lever 46b and is movable between a retracted position and an operative position where the roller 47b urges the magnetic tape against the capstan 48. The movement of the levers 46a and 46b and their respective pressure rollers 47a and 47b is controlled, respectively, by electromagnets 53a and 53b.

Magnetic heads 49 and 50 are provided on the left side of the vertical axis X—X' intermediate the roller 35a and the roller 37a and, in an analogous manner, magnetic heads 51 and 52 are provided on the right side of the vertical axis X—X' intermediate the rollers 35b and 37b. The various magnetic heads may be of the read/record type and the erase type. The position of the magnetic heads 49 and 50 is such that the magnetic tape will come into contact with the heads 49 and 50 when the pressure roller 42a, under the influence of electromagnet 44a, urges the magnetic tape against the capstan 38a. In a similar manner, the position of the heads 51 and 52 is such that the magnetic tape will come into contact with the heads 51 and 52 when the pressure roller 42b, under the control of the electromagnet 44a, urges the magnetic tape against the capstan 38b.

Vertically spaced apart rollers 54a and 60a are provided on the left side of the vertical axis X—X' to assist in forming an auxiliary tape loop with the roller 55a which is mounted on the distal end of a pivotal lever 56a. The lever 56a is mounted beneath the tape deck panel, is pivoted at 57a and resiliently biased towards the left lateral edge by a drawback spring 58a. The roller 55a extends upwardly through a semi-circular groove 59a formed in the tape deck panel.

In a like manner, vertically spaced rollers 54b and 60b are provided below the roller 47b on the right side of the vertical axis X—X' to cooperate with the roller 55b in forming an auxiliary loop. The roller 55b is rotatably mounted on the distal end of a lever 56b (broken line illustration) located beneath the tape deck panel. The lever 56b is pivotally mounted at 57b, with the roller 55b extending through a semi-circular groove 59b formed in the tape deck panel.

As shown in FIG. 1, the tape loop on the left hand side of the vertical axis X—X' extends about the roller 54a to the roller 55a and then to the roller 60a. In a like manner, the auxiliary tape loop on the right side of the vertical axis X—X' extends between the roller 54b and the roller 55b and then to the roller 60b.

The loop support device occupies the lower portion of the tape deck panel and includes a plurality of stationary rollers 63 and laterally movable rollers 62. The stationary rollers 63a are spaced along the vertical from one another on the left side of the vertical axis X—X'. In a similar manner, the stationary rollers 63b are vertically spaced from one another on the right side of the vertical axis X—X'. The movable rollers 62a are mounted in a vertically spaced relationship from one another on a suitable carriage means (not shown) located beneath the tape deck panel. The movable rollers 62a are adapted to move in horizontal grooves 66a from an inner position adjacent the vertical axis X—X' to an outward position adjacent the left edge of the tape deck panel. In a similar manner, the movable rollers 62b are mounted on a suitable carriage means (not shown) located beneath the tape deck panel and are vertically spaced from one another. As in the case of the rollers 62a, the movable rollers 62b extend through horizontal grooves 66b formed in a tape deck panel and are movable between an inner position adjacent the vertical axis X—X' to an outward position adjacent the right edge of a tape deck panel. The magnetic tape loop is entrained alternately about the movable rollers 62 and stationary rollers 63 on both sides of the vertical axis X—X'. As can be readily appreciated, the length of the magnetic tape loop supported by the rollers 62 and 63 may be changed from a short loop position where the movable rollers on both sides of the vertical axis X—X' are substantially adjacent the vertical axis X—X' to a long loop position where the movable rollers 62a and 62b are moved to their extreme lateral positions.

Figure 5:
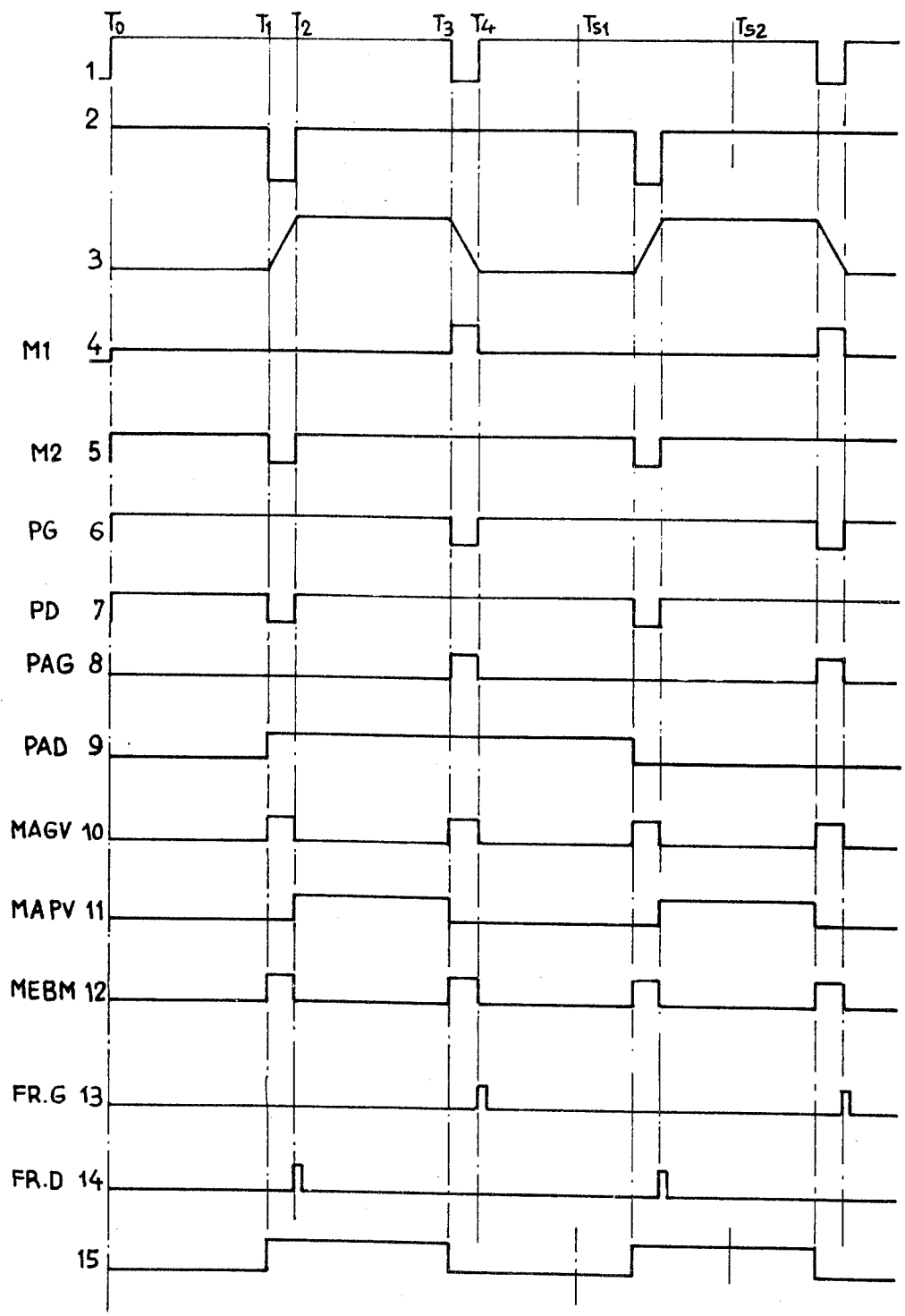
FIG. 5 is a timing control diagram for the apparatus of FIG. 4 showing control pulses and their sequential relationship.

The apparatus described above operates through successive cycles C in accordance with the control pulse and timing diagram of FIG. 5 which shows the various control pulse sequences and timing for the various elements described above over a full cycle C beginning with time $T = T_0$ and ending with $T = T_4$. The control functions for the various control lines, 1 through 15, shown in FIG. 5 are as follows:

1. Controls Switching of Magnetic Heads 49 and 50 to and from their respective amplifiers.
2. Controls Switching of the magnetic heads 50 and 51 to and from their respective amplifiers.
3. Controls motor 39 which drives capstans 38a and 38b.
4. Controls voltage applied to the supply reel 30 drive motor.
5. Controls voltage applied to the takeup reel 31 drive motor.
6. Controls the position of the pressure roller 42a (left side) between its operative and retracted positions.
7. Controls the position of the pressure roll 42b (right side) between its operative and retracted positions.
8. Controls the position of the pressure roll 47a between its operative and retracted positions.
9. Controls the position of the pressure roll 47b between its operative and retracted positions.

10. Controls the rotation of the capstan 48 for clockwise rotation.
11. Controls the rotation of the capstan 48 for counterclockwise rotation.
12. Controls the loop support device to command the formation of the long loop mode and the short loop mode.
13. Controls the application of a mechanical brake to the supply reel 30.
14. Controls the application of a mechanical brake to the takeup reel 31.
15. Indicates when the magnetic heads 49, 50, and 51, 52 are connected to their respective amplifiers.

As can be seen from FIG. 5, at $T = T_0$ the embodiment of FIG. 4 is brought into the control state designated herein as the short loop mode as follows.

The magnetic heads, 49 and 50; and 51, and 52 are connected to their respective amplifiers (Line 1, Line 2); the motor 39 is turned on (Line 3) to rotate the capstans 38a and 38b; the supply reel 30 drive motor is supplied with less than full voltage (Line 4) to place the magnetic tape under tension; the takeup reel 31 is supplied with full voltage (Line 5) to wind the magnetic tape onto the takeup reel 31; and the left and right pressure rolls 42a and 42b are actuated by their respective electromagnet 44a and 44b (Line 6, 7) to engage the magnetic tape with their respective rotating capstans 38a and 38b to transport the magnetic tape, respectively, past the magnetic heads 49 and 50, and the magnetic heads 50 and 51.

In the short loop mode, the magnetic tape is transported from the supply reel 30 under tension past the magnetic heads 49 and 50, through the various rollers to the loop support device and past the magnetic heads 51 and 52 to the takeup reel 31.

At $T = T_1$ the control state of the apparatus is changed from the short loop mode to the short loop to long loop transition mode as follows.

The right side magnetic heads 51 and 52 are disconnected from their respective amplifiers (Line 2); the pressure roller 42b is moved to is retracted position (Line 7); the voltage to the takeup reel 31 mode is removed (Line 5); the motor drive capstan 48 is driven in a clockwise direction at a fast speed (Line 10); and the right side pressure roller 47a is actuated to urge the magnetic tape against the rotating capstan 48 (Line 9) while a control pulse is issued to the loop support device to initiate loop expansion from the short loop mode to the long loop mode (Line 12).

At $T = T_1$ the magnetic tape is rapidly driven off the takeup reel 31 by the capstan 48 to supply tape to the expanding loop support device while the magnetic tape is unwound at normal recording speed from the supply reel 30 and transported by the capstan 38a past the sensing surface of the magnetic heads 49 and 50.

At $T = T_2$ the control state of the apparatus is changed to terminate the short loop to long loop transition mode and initiate the long loop mode as follows:

The right side magnetic heads 51 and 52 are reconnected to their respective amplifiers (Line 2); full voltage is reapplied to the takeup reel 31 motor; the fast clockwise rotation of the capstan 48 is halted (Line 10), with the rotation of the capstan 48 being reversed to counterclockwise slow speed (Line 9); the loop support device is commanded to stop (Line 12) and a momentary brake pulse is applied to the takeup reel 31 (Line 14).

At $T = T_2$ magnetic tape is being supplied from the supply reel 30 and driven past the magnetic heads 49 and 50 to the various capstan and rollers to the loop support device which is now operating in the long loop mode, past the magnetic heads 51 and 52 to the takeup reel 31.

At $T = T_3$ the control state of the apparatus is changed from the long loop mode and to the long loop to short loop transition mode as follows:

The left side magnetic heads 49 and 50 are disconnected from their respective amplifiers (Line 1); full voltage is applied to the drive motor of the supply reel 30 (Line 4); the left side pressure roll of 42a is retracted to disengage the magnetic tape from the capstan 38a (Line 5), the capstan 48 is commanded for clockwise rotation at quick speed (Line 10), and the loop set means is commanded to move from the long loop mode to the short loop mode (Line 12).

Thus, at time $T = T_3$ the loop set device is driven to the short loop mode with the excess tape wound onto the supply roll 30 while the magnetic tape continues in a normal manner past the magnetic heads 51 and 52 onto the takeup reel 31.

At the time $T = T_4$ the control state of the apparatus is changed to terminate the long loop to short loop transition mode and resume the short loop mode as follows:

The left side magnetic heads 49 and 50 are reconnected to their respective amplifiers (Line 1); partial voltage is supplied to the supply reel 30 drive motor to place the magnetic tape under tension (Line 4); the left pressure roller 42a is moved from its retracted position to its operative position to urge the magnetic tape against the capstan 38a (Line 6); the pressure roller 47a is retracted (Line 8), the quick clockwise rotation of the capstan 48 is halted (Lines 10, 11); the long loop to short loop movement of the loop support device is halted (Line 12); and a short brake pulse is provided to the supply reel 30 (Line 13).

During the period between $T_1$ and $T_2$, the operating speed of the loop setting device is regulated according to the position of the lever 56b on the right side of the auxiliary tape loop. During the period between $T_2$ and $T_3$, the auxiliary capstan 48 is controlled by the position of an auxiliary tape tension lever (not shown), similar to the lever 32a, located between the pressure roller 47b and the roller 37b. During the period between $T_3$ and $T_4$, the speed of the auxiliary capstan 48 is regulated by the position of the lever 56a. As can be appreciated, the tape speed for rewinding or dewinding the magnetic tape must be as fast as possible to maximize the periods of simultaneous recording by both sets of heads 39, 50; and 51, 52.

Should there occur at time $TS_1$ (FIG. 5), a signal recognized as of interest by an electronic device connected to the heads, the recording heads corresponding to the minimal recording length previous to the occurrence of the signal of interest are disconnected, in this case, magnetic heads 49 and 50. The signal recording continues until the signal of interest is over, at which the time the cycle is restarted at time $T_0$.

Should a signal of interest occur at the time $TS_2$, the magnetic heads 51, and 52 are disconnected. The period during which the magnetic heads 49, 50, or 51 and 52 are recording is represented on line 15. The heads which have been in the recording or surveillance mode the longest are the heads which are utilized to record signals of interest.

During the storage process, the non-recording magnetic heads are set aside from the tape or disconnected.

The storage process goes on until the end storage conditions occur. The tape segment which has just been stored is replaced by an unrecorded segment of tape taken from the supply reel 36, and the apparatus restarts the cycle C under the control of the driving electronic devices which determines the operation of the various motors, capstans, reels, and the loop support device, in accordance with the control diagram of FIG. 5.

As shown on lines 1 and 2 of FIG. 5, both sets of magnetic heads 49, 50, and 51, 52 record for equal periods of time during the cycle C with neither set of magnetic heads preferred over the other. One disadvantage of this arrangement is that unwanted signals are recorded upstream or ahead of the desired signal. While the unwanted signals can be erased, this leaves an unrecorded segment on a tape. The preferred recording arrangement is to select the magnetic heads which are nearest the takeup reel 31 when the signal of interest occurs. This way, signals occuring just prior to the signal of interest are recorded.

In some applications, such as in the FM process, it may be desirable to provide means to cause simultaneous erasing of the tape. This may be accomplished by providing an erase head (not shown) just upstream or in advance of the recording heads, on each side of the tape deck panel.

The tape reading or play-back function, either a delayed reading or a simultaneous reading, can be obtained by placing a read magnetic head downstream of each set of recording heads. The magnetic tape may be stored prior to its use and after its use on the tape deck in conventional tape carriers, such as, cassettes, reels, or the like.

One feature of the apparatus of the present invention allows automatic change of the tape loop to prevent excessive wear to the tape with a consequent deterioration of the recording quality. This is done by counting the number of direction changes of one of the pulleys, as, for example, pulley 19, or counting the number of displacements of the loop setting device.

Another feature of the present invention is that it may be equipped for remote control operation.

The control and drive electronic device 100 (FIG. 4) consists of an electronic device 100a to control the magnetic tape cycle connected to a programmer 100b which among others, establishes the feed and running direction of the tape by controlling the various motors which drive the reels, the capstans, and the loop supporting device, as well as the driving electromagnets for the pressure rollers; an electronic device to control the storage and the watching cycle C, with a programmer (e.g., test data presentation, comparaters, time lags. . .); and various operators for determining the operating state (rotation meters, electronic cells, etc.).

As will be apparent to those skilled in the art, various changes and modifications may be made to the apparatus of the present invention without departing from the spirit and scope of the present invention as recited in the appended claims and their legal equivalent.

We claim:

1. A device for recording signals on magnetic tape comprising:

a supply reel with means to drive said supply reel;
a takeup reel with means to drive said takeup reel;
loop support means intermediate said supply reel and said takeup reel, said loop support means adapted to support a loop of magnetic tape and being selectively actuatable to vary the length of said loop between a maximum and a minimum loop length;
a first tape drive capstan between said supply reel and said loop support means selectively engageable with said magnetic tape to transport said magnetic tape from said supply reel to said loop support means;
a first magnetic head between said supply reel and said loop support means selectively engageable with said magnetic tape;
a second drive capstan between said takeup reel and said loop support means selectively engageable with said tape to transport said magnetic tape from said loop support means to said takeup reel;
a second magnetic head between said takeup reel and said loop support means selectively engageable with said magnetic tape;
an auxiliary tape drive capstan intermediate said takeup reel and said loop support means selectively engageable with said magnetic tape between said takeup reel and said loop support means to transport said magnetic tape from said takeup reel to said loop support means at a transport speed higher than the transport speed of said first and second capstans;
said device operating in a cyclic manner in response to control signals from a control means, said cycle including
a short loop mode during which said magnetic tape is transported from said supply reel to said takeup reel through said loop support means which responds to said control means to support said tape at its minimum length loop, and during which said first and second capstans and heads engage said tape to record signals thereon;
a short loop to long loop transition mode during which said first capstan and magnetic head engage said tape to record signals thereon and transport said tape from said supply reel to said loop support means and during which said auxiliary tape capstan engages said tape to transport said tape from said takeup reel to said loop support means with said loop support means responding to said control means to vary the length of said loop from its minimum to its maximum length;
a long loop mode during which said tape is transported from said supply reel to said takeup reel through said loop support means with said loop support means responding to said control means to support said tape at its maximum loop length, and during which said first and second capstans and heads engage said tape to record signals thereon; and
a long loop to short loop transition mode during which said second capstan and head engage said tape to record signals thereon and transport said magnetic tape to said takeup reel, and during which said tape is transported from said loop support means to said supply reel with said loop support means responding to said control means to vary said loop length from its maximum to its minimum loop length.

2. The device for recording signals of magnetic tape claimed in claim 1, further comprising:

a recorded data storage mode wherein said cycle is selectively interrupted after signals are recorded on a segment of said magnetic tape, said segment is wound onto and stored on said takeup reel, and said cycle is resumed with unrecorded magnetic tape from said supply reel.

3. The device for recording signals on magnetic tape claimed in claim 1, in which said first magnetic head is inhibited from recording during said long loop to short loop transition mode, and said second magnetic head is inhibited from recording during said short loop to long loop transition mode.

4. The device for recording signals on magnetic tape claimed in claim 1, in which said first and second magnetic head simultaneously record information on said magnetic tape during said short loop and long loop mode.

5. The device for recording signals on magnetic tape claimed in claim 1, further comprising means for counting the number of direction changes of said loop support means.

6. The device for recording signals on magnetic tape claimed in claim 1, wherein said loop support means further comprise:
- a plurality of stationary magnetic tape rollers lineally spaced apart from one another; and
- a plurality of moveable magnetic tape rollers lineally spaced apart from one another and mounted on a moveable support moveable between a short loop position in which said stationary and said moveable rollers are adjacent one another, and a long loop position in which said stationary and said moveable rollers are spaced from one another.

* * * * *